(12) United States Patent
Take

(10) Patent No.: US 6,426,879 B1
(45) Date of Patent: Jul. 30, 2002

(54) LOAD ADJUSTMENT BOARD AND DATA PROCESSING APPARATUS

(75) Inventor: Masayuki Take, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/824,015

(22) Filed: Apr. 3, 2001

(30) Foreign Application Priority Data

Oct. 20, 2000 (JP) ......................................... 2000-320885

(51) Int. Cl.⁷ ................................................. H05K 1/16
(52) U.S. Cl. ....................... 361/766; 174/260; 361/760; 361/738
(58) Field of Search ............................... 174/260, 261; 361/760, 684, 737, 791, 683, 686, 752, 736, 761, 784, 785, 790, 696, 801, 797, 802, 803, 734, 738, 741; 439/61, 631, 65, 64, 941, 947, 928, 928.1; 257/723, 724; 333/32, 33, 12, 172, 174, 185, 182, 183; 710/301, 302; 365/148, 149, 63, 51, 52, 206, 189.1

(56) References Cited

U.S. PATENT DOCUMENTS

| | | | | |
|---|---|---|---|---|
| 5,031,073 A | * | 7/1991 | Chang | 361/778 |
| 5,036,481 A | * | 7/1991 | Lunsford et al. | 364/686 |
| 5,319,591 A | * | 6/1994 | Takeda et al. | 365/63 |
| 5,339,219 A | * | 8/1994 | Urich | 361/760 |
| 5,391,922 A | * | 2/1995 | Matsui | 257/773 |
| 6,087,676 A | * | 7/2000 | Akram et al. | 257/48 |
| 6,115,260 A | * | 9/2000 | Nakajima et al. | 361/760 |
| 6,122,695 A | * | 9/2000 | Cronin | 710/100 |
| 6,137,709 A | * | 10/2000 | Boaz et al. | 365/51 |
| 6,172,895 B1 | * | 1/2001 | Brown et al. | 365/63 |
| 6,266,252 B1 | * | 7/2001 | Karabatsos | 361/788 |

FOREIGN PATENT DOCUMENTS

JP          06-058577          8/1994

* cited by examiner

Primary Examiner—Kamand Cualo
Assistant Examiner—J B Patel
(74) Attorney, Agent, or Firm—McDermott, Will & Emery

(57) ABSTRACT

The invention provides a circuit-mounted board which can improve the reliability in the operations of a system having expansion slots. The load adjustment board is a circuit-mounted board to be used by being inserted into the expansion slot of the system, and comprises a plurality of connection pins to obtain electric connection with another board, and devices each having variable electric property, such as a variable resistance or a variable capacitor, provided for each connection pin. One end of each device is connected to the respective connection pin, and the other end is fixed to the predetermined potential (ground, for example). The board is inserted into a vacant slot of the expansion slots of the system to suppress reflection noise etc.

12 Claims, 3 Drawing Sheets

LOAD ADJUSTMENT BOARD AND DATA PROCESSING APPARATUS

BACKGROUND OF THE INVENTION

1. Field of the Invention

The present invention relates to a circuit-mounted board to be inserted into an expansion slot of a data processing apparatus such as a computer system, more particularly to a load adjustment board capable of adjusting a load value thereof.

2. Related Art

FIG. 4 shows a conventional memory module to be inserted into a memory expansion slot of a computer system or the like. The memory module 20 has a plurality of memory ICs 25 mounted on a printed circuit having a multi-layered structure. A contact 21 and each pin 25a of the memory IC 25 are electrically connected to each other via internal wiring of the printed circuit or external wiring 27.

FIG. 5 shows the motherboard of the computer system in which the memory modules 20 are inserted. On the motherboard 52 with a multi-layered structure, a memory controller 54 and a plurality of sockets 38a for memory module are mounted. Each memory module 20 is inserted into a socket 38a. The memory controller 54 and the sockets 38a are connected via internal wiring or external wiring 52a so as to carry electric signals between the memory controller 54 and the memory ICs 25.

In the computer system shown in. FIG. 5, when there is a vacant slot X of the slots 38a on the motherboard 52 to which no memory module 20 is connected, the extremely light-weight load on the signal line of the vacant slot X may cause the system to malfunction due to undesired high frequency reflection noise or the like. This sometimes becomes a problem in the reliability of the operations of the system.

SUMMARY OF THE INVENTION

The present invention has been contrived to solve the above-mentioned problem, and has an object of providing a board mounted with circuits and capable of improving the reliability in the operations of the system having expansion slots.

A load adjustment board according to the present invention is a board mounted with circuits and is to be inserted into an expansion slot of a data processing apparatus. The load adjustment board comprises a plurality of connection pins to obtain electric connection in the expansion slot, and devices each having variable electric properties. Each of the devices is provided for one of the plurality of connection pins. The one end of the device is connected to the one of the plurality of connection pins, and the other end of the device is connected to a node which supplies a predetermined potential.

Thus, the insertion of the load adjustment board according to the present invention into the expansion slot can eliminate undesired high frequency components on the signal line of the slot and reduce reflection noise, thereby improving the reliability in the operations of the data processing apparatus.

In the load adjustment board, the device may comprise a variable resistor, a variable capacitor, or a combination of these. By using such an electrical property variable device, the load on the signal line can be adjusted in accordance with the drivability of the memory controller or the load of the memory modules.

The predetermined potential may be a ground potential. Fixing to the ground potential can cut off undesired high frequency components on the signal line of the slot to reduce reflection noise.

The load adjustment board may further comprise means for adjusting a length of wiring between the device and the connection pin. Thus the load on the signal line can be finely adjusted.

A data processing apparatus according to the present invention comprises an expansion slot into which a board for expanding function of the device is inserted, and the load adjustment board which is inserted into the expansion slot. In the data processing apparatus, the expansion slot may be a memory expansion slot.

According to the data processing apparatus of the present invention, inserting the above-described load adjustment board into an expansion slot such as a memory expansion slot cuts off undesired high frequency components on the signal line of the slot, and reflection noise, thereby improving the reliability in the operations of the device.

BRIEF DESCRIPTION OF THE DRAWINGS

A better understanding of the invention will be obtained by reading the description of the preferred embodiment below, with reference to the following drawings, in which.

DETAILED DESCRIPTION OF THE PREFERRED EMBODIMENTS

The embodiments of a load adjustment board of the present invention will be described as follows, with reference to the accompanying drawings.

Figure 1A:
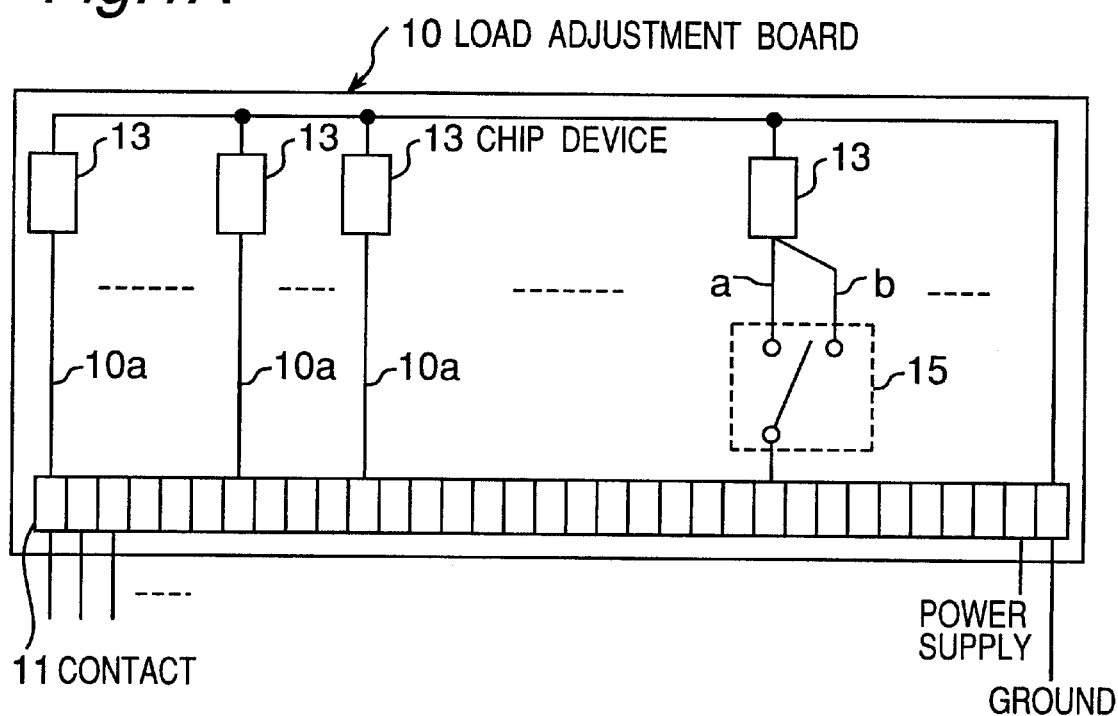
FIG. 1A shows the load adjustment board of the present invention.

FIG. 1A shows a load adjustment board of the present invention. The load adjustment board of the present invention is used by being inserted into a vacant slot of memory expansion slots of a data processing apparatus such as a computer, and reduces interruptions or reflection noise of undesired high frequency components developed on the signal line of the slot.

A load adjustment board 10 includes contacts 11 which are connection pins to obtain electric connection with the pins provided in the slot when the board 10 is inserted into the memory expansion slot. The contacts 11 are so arranged as to correspond to the pins set for the respective signal lines in the slots. The load adjustment board 10 contains electronic chip devices 13 having electric properties equivalent to resistance, capacitor, inductor or a circuit combining these in series or parallel. Each chip device 13 is provided for each contact 11 corresponding to the signal line. One end of each chip device 13 is connected to the corresponding contact 11 via wiring 10a and the other end is connected or fixed to the ground potential. The ground potential is supplied from outside via the ground pin of the contact 11. Instead of the ground, the chip devices 13 can be connected to a node which supplies the predetermined potential (for example, the node which supplies a potential of the power supply voltage or a potential obtained by dividing the potential of the power supply voltage). Thus, each contact 11 of the load adjustment board 10 is terminated via the respective chip device 13. Some of the contacts 11 of the load adjustment board 10 can be terminated by being directly connected to a node which supplies a predetermined potential such as the ground without the intervention of the chip devices 13.

Figure 1B:
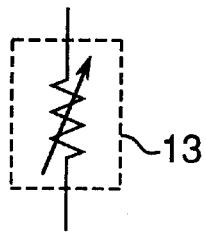
FIGS. 1B to 1D show examples of the chip devices mounted on the load adjustment board of the present invention.
Figure 1C:
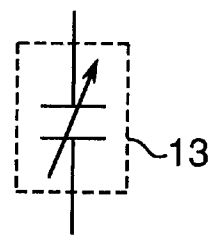
Figure 1D:
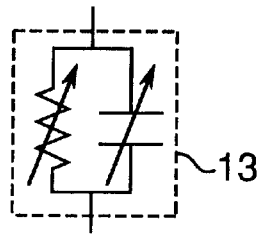

The chip devices 13 mounted on the load adjustment board 10 can be composed of an element whose electric physical characteristic is variable such as a variable resistor (refer to FIG. 1B), a variable capacitor (refer to FIG. 1C), or a parallel circuit of a variable resistor and a variable capacitor (refer to FIG. 1D) Using a device having variable electric properties as each chip device 13 makes it possible to adjust the load value of the load adjustment board 10 as desired.

In the load adjustment board 10 of the present embodiment, the length of the wiring 10a between the chip devices 13 and the contacts 11 can be changeable. As shown in FIG. 1, this is realized by arranging relays 15 between the chip device 13 and the contact 11, and by selecting one of wiring patterns a and b having different lengths from each other so as to adjust the wiring length between the chip devices 13 and the contacts 11. The provision of the wiring patterns having different lengths makes the inductance and the like of the wiring patterns variable, thereby achieving fine adjustment of the value of the load of the load adjusting board 10.

Figure 2:
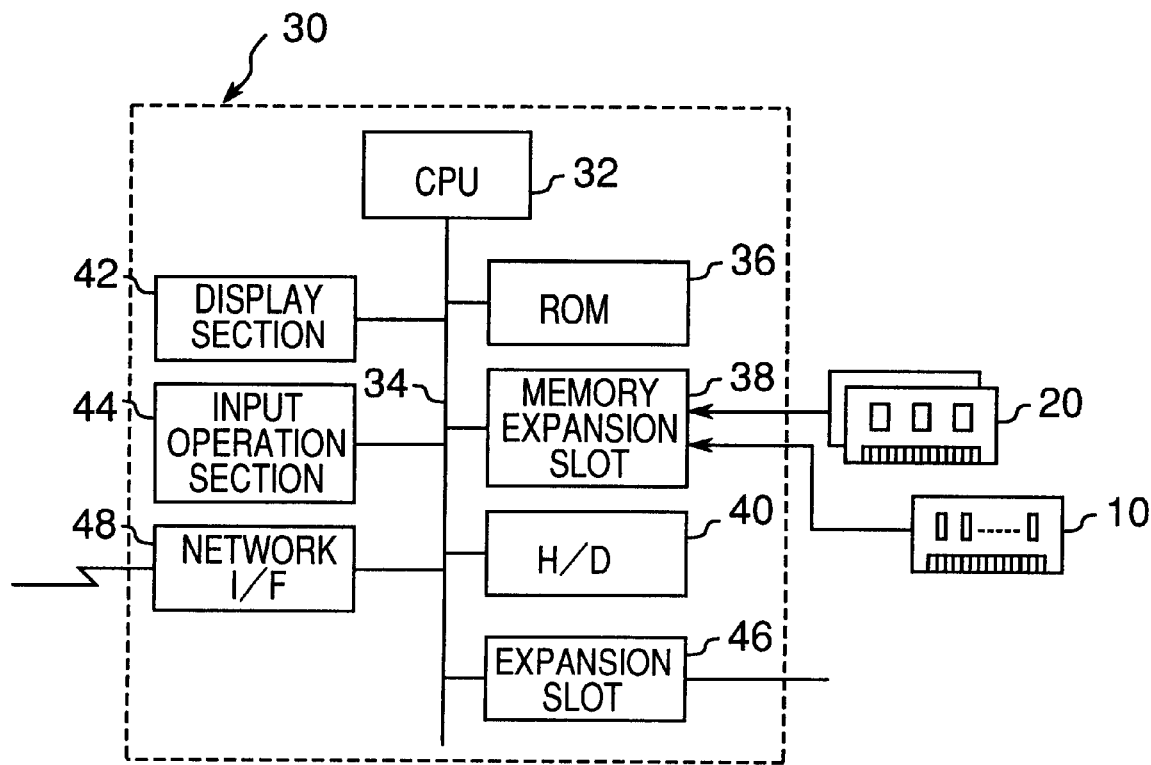
FIG. 2 shows the structure of the computer which utilizes the load adjustment board of the present invention.

FIG. 2 shows the structure of a computer in which the above described load adjusting board 10 is to be inserted. The computer 30 shown in FIG. 2 includes a CPU 32 which executes predetermined programs. The CPU 32 is connected, via a bus 34 for carrying data and control signals, to a ROM 36, a memory expansion slot unit 38, a hard disk 40, a display section 42, an input operation section 44, an expansion slot unit 46, and a network interface 48. The ROM 36 stores basic programs and data executed in the CPU 32. The display section 42 comprises a liquid crystal display (LCD) or a CRT display. The input operation section 44 comprises a keyboard or a mouse. The memory expansion slot unit 38 comprises a plurality of slots into which memory modules for increasing total memory capacity are inserted. The load adjustment board 10 is used in a vacant slot in the memory expansion slot unit 38. The expansion slot unit 46 comprises slots into which expansion boards to expand functions of the computer or connect with other apparatuses are inserted.

Figure 3:
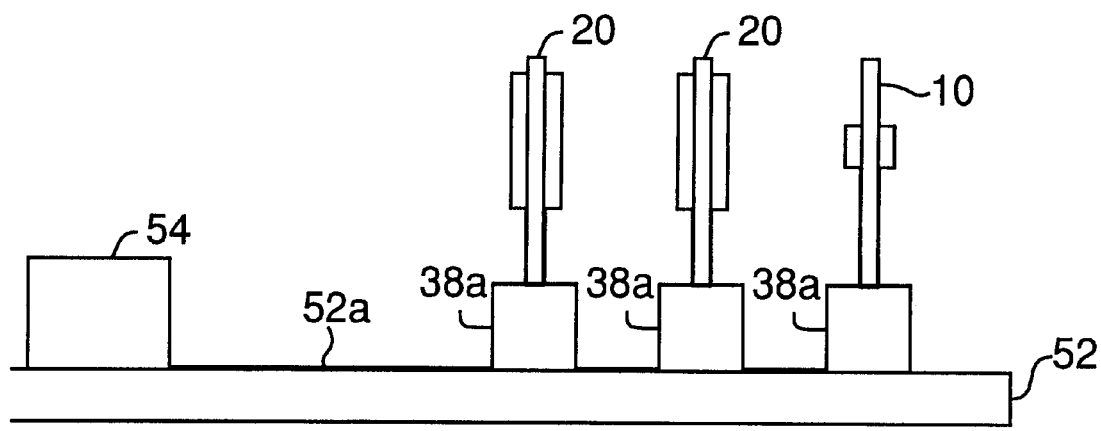
FIG. 3 shows a state of the motherboard where the load adjustment board of the present invention is inserted.
Figure 4:
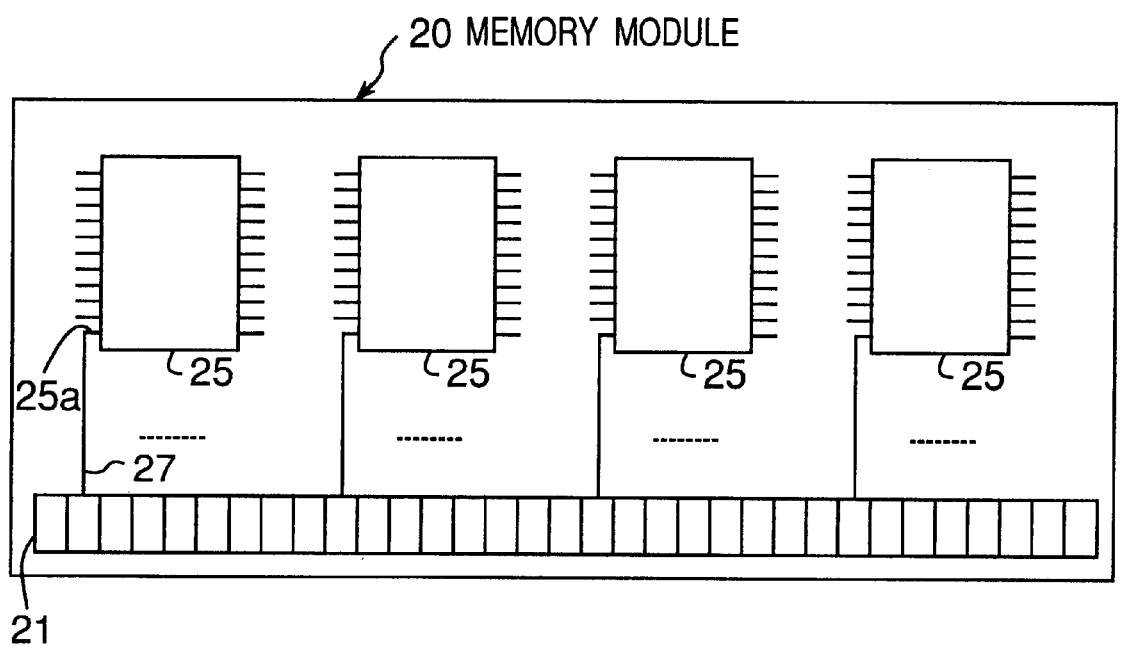
FIG. 4 shows a conventional memory module.
Figure 5:
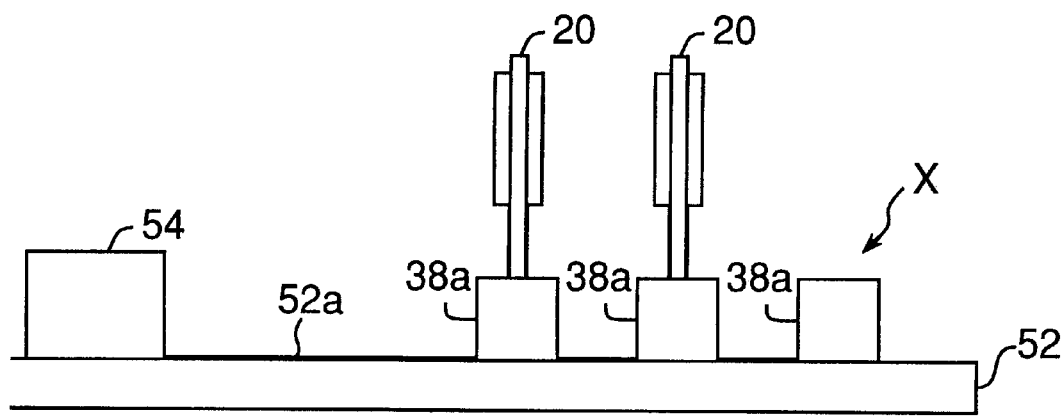
FIG. 5 shows a state of the motherboard where the memory module is inserted.

FIG. 3 shows a state of the load adjustment board 10 of the present embodiment mounted on the motherboard of the computer. On the motherboard 52 having a multi-layered structure, a memory controller 54 and sockets 38 each provided for a slot of the memory expansion slot unit 38 are mounted. In the memory expansion slot unit 38, necessary memory modules 20 are inserted into the sockets 38a. The load adjustment board 10 is inserted in the socket 38a of a vacant slot. The memory controller 54 and the sockets 38a are electrically connected via the internal wiring or external wiring 52a of the motherboard 52.

As described above, the insertion of the load adjustment board 10 of the present embodiment into a slot of the computer applies a load on the signal lines so as to cut off undesired high frequency components, thereby reducing reflection noise and the like. Since the chip devices 13 are each comprising an element whose electric physical characteristic is variable such as a variable resistance or a variable capacitor, the load on the signal lines can be adjusted in accordance with the drivability of the memory controller or the load of the memory modules 20. In addition, the changeable length of the wiring for the chip devices 13 realizes fine adjustment of the load on the signal line.

Although in this embodiment the description is made so that the load adjustment board is inserted into a slot for memory expansion, the board may be so structured as to be inserted into an expansion slot which is connected with external apparatus or to expand functions.

Although the present invention has been described in connection with specified embodiments thereof, many other modifications, corrections and applications are apparent to those skilled in the art. Therefore, the present invention is not limited by the disclosure provided herein but limited only to the scope of the appended claims.

What is claimed is:

1. A load adjustment board which is a board mounted with circuits and is to be inserted into an expansion slot of a data processing apparatus, the expansion slot having a tendency to generate noise when the expansion slot is open, the load adjustment board comprising:

a plurality of connection pins to obtain electric connection in said expansion slot; and electrical devices each having variable electric properties, each of said electrical devices being provided for one of said plurality of connection pins, and one end of the electrical device being connected to said one of said plurality of connection pins, and the other end of the electrical device being connected to a node which supplies a predetermined potential, wherein a desired value of the variable electrical property of each electrical device is selected to suppress the noise generated by the open expansion slot.

2. The load adjustment board according to claim 1, wherein said electrical device comprises a variable resistor, a variable capacitor, or a combination of these.

3. The load adjustment board according to claim 1, wherein said predetermined potential is a ground potential.

4. The load adjustment board according to claim 1 further comprising means for adjusting a length of wiring between the electrical device and the connection pin.

5. A data processing apparatus comprising:

an expansion slot into which a board for expanding function of the electrical device is inserted; and the load adjustment board according to claim 1, the load adjustment board being inserted into the expansion slot.

6. The data processing apparatus according to claim 5, wherein said expansion slot is a memory expansion slot.

7. A data processing apparatus comprising:

an expansion slot into which a board for expanding function of the electrical device is inserted; and the load adjustment board according to claim 2, the load adjustment board being inserted into the expansion slot.

8. The data processing apparatus according to claim 7, wherein said expansion slot is a memory expansion slot.

9. A data processing apparatus comprising:

an expansion slot into which a board for expanding function of the electrical device is inserted; and the load adjustment board according to claim 3, the load adjustment board being inserted into the expansion slot.

10. The data processing apparatus according to claim 9, wherein said expansion slot is a memory expansion slot.

11. A data processing apparatus comprising:

an expansion slot into which a board for expanding function of the electrical device is inserted; and the load adjustment board according to claim 4, the load adjustment board being inserted into the expansion slot.

12. The data processing apparatus according to claim 8, wherein said expansion slot is a memory expansion slot.

* * * * *